US009184301B2

(12) United States Patent
Bangsaruntip et al.

(10) Patent No.: US 9,184,301 B2
(45) Date of Patent: Nov. 10, 2015

(54) PLANAR AND NANOWIRE FIELD EFFECT TRANSISTORS

(75) Inventors: Sarunya Bangsaruntip, Yorktown Heights, NY (US); Guy M. Cohen, Yorktown Heights, NY (US); Shreesh Narasimha, Yorktown Heights, NY (US); Jeffrey W. Sleight, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 221 days.

(21) Appl. No.: 13/600,598

(22) Filed: Aug. 31, 2012

(65) Prior Publication Data
US 2012/0319084 A1 Dec. 20, 2012

Related U.S. Application Data

(63) Continuation of application No. 12/631,342, filed on Dec. 4, 2009, now Pat. No. 8,455,334.

(51) Int. Cl.
*H01L 29/66* (2006.01)
*H01L 29/786* (2006.01)
*B82Y 10/00* (2011.01)
*B82Y 40/00* (2011.01)
(Continued)

(52) U.S. Cl.
CPC ............ *H01L 29/78696* (2013.01); *B82Y 10/00* (2013.01); *B82Y 40/00* (2013.01); *H01L 21/84* (2013.01); *H01L 27/1203* (2013.01); *H01L 29/0665* (2013.01); *H01L 29/0673* (2013.01); *H01L 29/42392* (2013.01); *H01L 29/66439* (2013.01); *H01L 29/66772* (2013.01); *H01L 29/66469* (2013.01)

(58) Field of Classification Search
CPC ............ H01L 29/785; H01L 29/66795; H01L 21/823821; H01L 29/1037; H01L 29/42392; H01L 2029/7858; H01L 27/10826
USPC .................. 257/29, 327, 350, 351, 365, 401, 257/E29.245, E29.284, E29.001, E29.052, 257/E21.294, E21.444, E21.633, E21.635; 438/595, 153, 275; 977/762
See application file for complete search history.

(56) References Cited

U.S. PATENT DOCUMENTS

| 4,995,001 | A | 2/1991 | Dawson et al. |
| 5,308,445 | A | 5/1994 | Takasu |

(Continued)

FOREIGN PATENT DOCUMENTS

| EP | 217811 A1 | 4/2010 |
| KR | 20090044799 A | 5/2009 |
| WO | 02084757 A1 | 10/2002 |
| WO | WO2008069765 A1 | 6/2008 |

OTHER PUBLICATIONS

Andriotis et al., 'Realistic nanotube-metal contact configuration for molecular electronics applications, IEEE Sensors Journal, vol. 8, No. 6, Jun. 2008.
(Continued)

*Primary Examiner* — Meiya Li
(74) *Attorney, Agent, or Firm* — Cantor Colburn LLP

(57) ABSTRACT

An integrated circuit includes a plurality of gate-all-around (GAA) nanowire field effect transistors (FETs), a plurality of omega-gate nanowire FETs, and a plurality of planar channel FETs, wherein the plurality of GAA FETs, the plurality of omega-gate nanowire FETs, and the plurality of planar channel FETs are disposed on a single wafer.

5 Claims, 10 Drawing Sheets

(51) Int. Cl.
  *H01L 21/84* (2006.01)
  *H01L 27/12* (2006.01)
  *H01L 29/06* (2006.01)
  *H01L 29/423* (2006.01)

(56) References Cited

U.S. PATENT DOCUMENTS

| | | |
|---|---|---|
| 5,438,018 A | 8/1995 | Mori et al. |
| 5,552,622 A | 9/1996 | Kimura |
| 5,574,308 A | 11/1996 | Mori et al. |
| 5,668,046 A | 9/1997 | Koh et al. |
| 6,365,465 B1 | 4/2002 | Chan et al. |
| 6,642,115 B1 | 11/2003 | Cohen et al. |
| 6,653,209 B1 | 11/2003 | Yamagata |
| 6,665,554 B1 | 12/2003 | Charles et al. |
| 6,806,141 B2 | 10/2004 | Kamins |
| 6,835,618 B1 | 12/2004 | Dakshina-Murthy et al. |
| 6,855,606 B2 | 2/2005 | Chen et al. |
| 6,882,051 B2 | 4/2005 | Majumdar et al. |
| 6,891,227 B2 | 5/2005 | Appenzeller et al. |
| 6,903,013 B2 | 6/2005 | Chan et al. |
| 6,996,147 B2 | 2/2006 | Majumdar et al. |
| 7,101,762 B2 | 9/2006 | Cohen et al. |
| 7,151,209 B2 | 12/2006 | Empedocles et al. |
| 7,180,107 B2 | 2/2007 | Appenzeller et al. |
| 7,211,853 B2 | 5/2007 | Bachtold e |
| 7,253,060 B2 | 8/2007 | Yun et al. |
| 7,297,615 B2 | 11/2007 | Cho et al. |
| 7,311,776 B2 | 12/2007 | Lin et al. |
| 7,443,025 B2 | 10/2008 | Verbist |
| 7,446,025 B2 | 11/2008 | Cohen et al. |
| 7,449,373 B2 | 11/2008 | Doyle et al. |
| 7,452,759 B2 | 11/2008 | Sandhu |
| 7,452,778 B2 | 11/2008 | Chen et al. |
| 7,456,068 B2 | 11/2008 | Kavalieros et al. |
| 7,456,476 B2 | 11/2008 | Hareland et al. |
| 7,473,943 B2 | 1/2009 | Mostarshed et al. |
| 7,498,211 B2 | 3/2009 | Ban et al. |
| 7,534,675 B2 | 5/2009 | Bangsaruntip et al. |
| 7,550,333 B2 | 6/2009 | Shah et al. |
| 7,569,941 B2 | 8/2009 | Majumdar et al. |
| 7,642,578 B2 | 1/2010 | Lee et al. |
| 7,791,144 B2 | 9/2010 | Chidambarrao et al. |
| 7,795,677 B2 | 9/2010 | Bangsaruntip et al. |
| 7,799,657 B2 | 9/2010 | Dao |
| 7,803,675 B2 | 9/2010 | Suk et al. |
| 7,834,345 B2 | 11/2010 | Bhuwalka et al. |
| 7,871,870 B2 | 1/2011 | Mostarshed et al. |
| 7,893,506 B2 | 2/2011 | Chau et al. |
| 8,064,249 B2 | 11/2011 | Jang et al. |
| 8,097,515 B2 | 1/2012 | Bangsaruntip et al. |
| 8,154,127 B1 | 4/2012 | Kamins et al. |
| 8,338,280 B2 | 12/2012 | Tan et al. |
| 8,541,774 B2 | 9/2013 | Bangsaruntip et al. |
| 2004/0149978 A1 | 8/2004 | Snider |
| 2004/0166642 A1 | 8/2004 | Chen et al. |
| 2005/0121706 A1 | 6/2005 | Chen et al. |
| 2005/0266645 A1 | 12/2005 | Park |
| 2005/0275010 A1 | 12/2005 | Chen et al. |
| 2006/0033145 A1 | 2/2006 | Kakoschke et al. |
| 2006/0131665 A1 | 6/2006 | Murthy et al. |
| 2006/0138552 A1 | 6/2006 | Brask et al. |
| 2006/0197164 A1 | 9/2006 | Lindert et al. |
| 2007/0001219 A1 | 1/2007 | Radosavljevic et al. |
| 2007/0267619 A1 | 11/2007 | Nirschl |
| 2007/0267703 A1 | 11/2007 | Chong et al. |
| 2007/0284613 A1 | 12/2007 | Chui et al. |
| 2008/0014689 A1 | 1/2008 | Cleavelin et al. |
| 2008/0061284 A1 | 3/2008 | Chu et al. |
| 2008/0067495 A1 | 3/2008 | Verhulst |
| 2008/0067607 A1 | 3/2008 | Verhulst et al. |
| 2008/0079041 A1 | 4/2008 | Suk et al. |
| 2008/0085587 A1 | 4/2008 | Wells et al. |
| 2008/0121932 A1 | 5/2008 | Ranade |
| 2008/0128760 A1 | 6/2008 | Jun et al. |
| 2008/0135949 A1 | 6/2008 | Lo et al. |
| 2008/0142853 A1 | 6/2008 | Orlowski |
| 2008/0149914 A1 | 6/2008 | Samuelson et al. |
| 2008/0149997 A1 | 6/2008 | Jin et al. |
| 2008/0150025 A1 | 6/2008 | Jain |
| 2008/0179752 A1 | 7/2008 | Yamauchi et al. |
| 2008/0191196 A1 | 8/2008 | Lu et al. |
| 2008/0191271 A1* | 8/2008 | Yagishita et al. ............ 257/327 |
| 2008/0224224 A1 | 9/2008 | Vandenderghe et al. |
| 2008/0227259 A1 | 9/2008 | Avouris et al. |
| 2008/0246021 A1 | 10/2008 | Suk et al. |
| 2008/0247226 A1 | 10/2008 | Liu et al. |
| 2008/0290418 A1 | 11/2008 | Kalburge |
| 2009/0026553 A1 | 1/2009 | Bhuwalka et al. |
| 2009/0057650 A1 | 3/2009 | Lieber et al. |
| 2009/0057762 A1 | 3/2009 | Bangsaruntip et al. |
| 2009/0061568 A1 | 3/2009 | Bangsaruntip et al. |
| 2009/0090934 A1 | 4/2009 | Tezuka et al. |
| 2009/0134467 A1 | 5/2009 | Ishida et al. |
| 2009/0149012 A1 | 6/2009 | Brask et al. |
| 2009/0181477 A1 | 7/2009 | King et al. |
| 2009/0217216 A1 | 8/2009 | Lee et al. |
| 2009/0290418 A1 | 11/2009 | Han |
| 2009/0294864 A1 | 12/2009 | Suk et al. |
| 2010/0140589 A1 | 6/2010 | Ionescu |
| 2010/0193770 A1 | 8/2010 | Bangsaruntip et al. |
| 2010/0207102 A1 | 8/2010 | Lee et al. |
| 2011/0012176 A1 | 1/2011 | Chidambarrao et al. |
| 2011/0133167 A1 | 6/2011 | Bangsaruntip et al. |
| 2011/0133169 A1 | 6/2011 | Bangsaruntip et al. |
| 2011/0147840 A1 | 6/2011 | Cea et al. |
| 2012/0146000 A1 | 6/2012 | Bangsaruntip et al. |
| 2013/0001517 A1 | 1/2013 | Bangsaruntip et al. |

OTHER PUBLICATIONS

Bahar, R., "Trends and Future Directions in Nano Structure Based Computing and Fabrication", ICCD 2006, International Conf. on Computer Design, Oct. 1-4, 2007, pp. 522-527.

Bjork et al., "Silicon Nanowire Tunneling Field-Effect Transistors," Applied Physics Letters 92, 193504 (2008).

Buddharaju et al., "Gate-All-Around Si-Nanowire CMOS Inverter Logic Fabricated Using Top-Down Approach", European Solid-State Device Research Conference, Sep. 11-11, 2007, pp. 303-306.

Checka, N., "Circuit Architecture for 3D Integration", Chapter 13 in Wafer Level 3-D ICs Process Technology, ed. C.S. Tan, Springer US, 2008, ISBN 978-0-387-76534-1.

Chen et al., "An Integrated Logic Circuit Assembled ona Single Carbon Nanotube", www.sciencemag.org Science, vol. 311, Mar. 24, 2006, p. 1735.

Chen et al., "Demonstration of Tunneling FETs Based on Highly Scalable Verticle Silicon Nanowires", IEEE Electron Device Letters, vol. 30, No. 7, Jul. 2009, pp. 754-756.

Derycke, et al, "Carbon Nanotube Inter- and Intramolecular Logic Gates" Nano Letters, Sep. 2001, vol. 1, No. 9, pp. 453-456.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

Gates, Alexander J., "Designing a Nanoelectronic Circuit to Control a Millimeter-scale Walking Robot," Mitre Technical Paper, Nov. 2004, http://www.mitre.org/work/tech_papersitech_papers_04/04_1248/04_1248.pdf.

Hu et al., "Fringing field effects on electrical resistivity of semiconductor nanowire-metal contacts", Applied Physics Letters 92, 083503_2008.

Knoch et al., "Tunneling phenomena in carbon nanotube field-effect transistors", Phys Stat Sol. (a) 205, No. 4, 679-694 (2008).

Lauhon et al., "Epitaxial core-shell and core-multishell nanowire heterostructures", Nature, vol. 420, Nov. 7, 2002, pp. 57-61.

Leonard et al., "Size-dependent effects on electrical contacts to nanotubes and nanowires", Phys Rev Lett., Jul. 14, 2006; 97(2):026804.

Ma et al., "High-performance nanowire complementary metal-semiconductor inverters", Applied Physics Letters 93, 053105_2008.

Saumitra Raj mehrotra, "A Simulation Study of Silicom Nanowire Field Effect Transistors (FETs)", University of Cincinnati, Jul. 2007.

(56) References Cited

OTHER PUBLICATIONS

Neudeck, G.W., "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., Jun. 30, 2003, pp. 214-217.
International Search Report—Written Opinion; International Application No. PCT/US2011/029304; International Filing Date: Mar. 22, 2011; Date of Mailing: May 20, 2011.
International Search Report; International Application No. PCT/EP2010/066961; International Filing Date: Nov. 8, 2010; Date of Mailing: Feb. 10, 2011.
International Search Report; International Application No. PCT/US2011/029304; International Filing Date: Mar. 22, 2011; Date of Mailing: May 20, 2011.
International Search Report; International Application No. PCT/EP2010/066483; International Filing Date: Oct. 29, 2010; Date of Mailing: Feb. 7, 2011.
International Search Report; International Application No. PCT/EP2011/053174; International Filing Date: Mar. 3, 2011; Date of Mailing: May 31, 2011.
International Search Report—Written Opinion; International Application No. PCT/EP2010/066483; International Filing Date: Oct. 29, 2010; Date of Mailing: Feb. 7, 2011.
International Search Report; International Application No. PCT/US11/49501; International Filing Date: Aug. 29, 2011; Date of Mailing: Jan. 18, 2012.
International Search Report—Written Opinion; International Application No. PCT/EP2010/066961; International Filing Date: Nov. 8, 2010; Date of Mailing: Feb. 10, 2011.
International Search Report Written Opinion; International Application No. PCT/US11/49501; International Filing Date: Aug. 29, 2011; Date of Mailing: Jan. 18, 2012.
International Search Report—Written Opinion; International Application No. PCT/EP2011/053174; International Filing Date: Mar. 3, 2011; Date of Mailing: May 31, 2011.
Office Action—Non-Final for U.S. Appl. No. 12/684,280, filed Jan. 8, 2010; First Named Inventor: Sarunya Bangsaruntip; Mailing Date: May 2, 2011.
Office Action—Non-Final for U.S. Appl. No. 12/778,315, filed May 12, 2010; First Named Inventor: Sarunya Bangsaruntip; Mailing Date: Mar. 26, 2012.
Office Action—Non-Final for U.S. Appl. No. 12/856,718, filed Aug. 16, 2010; first Named Inventor Sarunya Bangsaruntip; Mailing Date: Jul. 9, 2012.
Office Action—Non-Final for U.S. Appl. No. 12/776,485, filed May 10, 2010; Fist Named Inventor: Sarunya Bangsaruntip: Mailing Date: Feb. 21, 2012.
Office Action—Non-Final for U.S. Appl. No. 13/372,719, filed Feb. 14, 2012; First Named Inventor: Sarunya Bangsaruntip; Mailing Date: May 7, 2012.
Office Action—Restriction Electrion for U.S. Appl. No. 12/684,280, filed Jan. 8, 2010; First Named Inventor: Sarunya Bangsaruntip; Mailing Date: Feb. 10, 2011.
Office Action—Restriction Election for U.S. Appl. No. 12/776,485, filed May 10, 2010;First Named Inventor: Sarunya Bangsaruntip; Mailing Date: Dec. 9, 2011.
Office Action—Final for U.S. Appl. No. 12/684,280, filed Jan. 8, 2010; First Namd Inventor: Sarunya Bangsaruntip; Mailing Date: Oct. 5, 2011.
Office Action—Restriction/Election for U.S. Appl. No. 12/758,939, filed Apr. 13, 2010; First Named Inventor: Sarunya Bangsaruntip; Mailing Date: Jun. 8, 2012.
Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.
Singh et al., "Si, SiGe Nanowire Devices by Top-Down Technology and Their Applications", IEEE Transactions on Electron Devices, vol. 55, No. 11, Nov. 2008, pp. 3107-3118.
Su et al., New Planar Self-Aligned Double-Gate Fully Depleted P-MOSFET's Using Epitaxial Lateral Overgrowth (ELO) and Selectively Grown Source/Drain (S/D).
Xiang et al., "Ge/Si Nanowire Heterostructures as High-Performance Field-Effect Transistors," Nature 441, 489-493 (May 25, 2006).
Ziegler et al., "The CMOS/NANO Interface from a Circuits Perspective," ISCAS '03. Proceedings of the 2003 International Symposium on Circuits and Systems, 2003, May 25-28, 2003, Volume: 4, pp. IV-904-IV-907.
Office Action—Notice of Allowance for Application No. 13/551,995; Filing Date: Jul. 18, 2012; First Named Inventtor: Sarunya Bangsaruntip: Mailing Date: Jul. 15, 2014; 13 pages.
Office Action—Final for U.S. Appl. No. 12/856,718, filed Aug. 16, 2010; First Named Inventor: Sarunya Bangsaruntip; Mailing Date: Dec. 13, 2012.
Office Action—Final for U.S. Appl. No. 13/551,995, filed Jul. 18, 2012; First Named Inventor: Sarunya Bangsaruntip; Mailing Date Apr. 30, 2013, 11 pgs.
Office Action—Non-Final for U.S. Appl. No. 13/550,700, filed Jul. 17, 2012; First Named Inventor: Sarunya Bangsaruntip; Mailing Date: Apr. 25, 2013, 27 pgs.
Office Action—Non-Final for U.S. Appl. No. 13/556,300, filed Jul. 24, 2012; First Named Inventor: Sarunya Bangsaruntip; Mailing Date: Dec. 10, 2012.
Office Action—Non-Final for U.S. Appl. No. 13/600,585, filed Aug. 31, 2012; First Named Inventor: Sarunya Bangsaruntip; Mailing Date: Dec. 13, 2012.
Office Action—Non-Final for U.S. Appl. No. 13/551,995, filed Jul. 18, 2012; First named Inventor: Sarunya Bangsaruntip; Mailing Date: Dec. 19, 2012.
Office Action—Non-Final for U.S. Appl. No. 13/372,719, filed Feb. 14, 2012; First Named Inventor: Sarunya Bangsaruntip; Mailing Date: Jul. 5, 2013, 28 pgs.
Office Action—Non-Final for U.S. Appl. No. 13/372,714, filed Feb. 14, 2012; Fist Named Inventor: Sarunya Bangsaruntip et al. Mailing Date: Sep. 20, 2012.
Office Action—Non-Final for U.S. Appl. No. 13/372,719, filed Feb. 14, 2012; First Named Inventor: Sarunya Bangsaruntip; Mailing Date: Sep. 4, 2012.
Office Action—Non-Final for U.S. Appl. No. 12/884,707, filed Sep. 17, 2010; Fist Named Inventor: Sarunya Bangsaruntip et al. Mailing Date: Oct. 2, 2012.
Office Action—Restriction Election for U.S. Appl. No. 12/776,485, filed May 10, 2010; First Named Inventor: Sarunya Bangsaruntip; Mailing Date: Dec. 9, 2011.
Transmittal and International Preliminary Report on Patentability for International Application No. PCT/US2011/029304; International Filing Date: Mar. 22, 2011; date of mailing Oct. 26, 2012, 2 pages.
Notice of Allowance for U.S. Appl. No. 12/776,485, filed May 10, 2010; First Named Inventor: Sarunya Bangsaruntip; Mailing Date: Sep. 26, 2012.
Office Action—Final for U.S. Appl. No. 13/372,719, filed Feb. 14, 2012; First Named Inventor: Sarunya Bangsaruntip; Mailing Date: Sep. 4, 2012.
Office Action—Non-Final for U.S. Appl. No. 12/631,199, filed Dec. 4, 2009; First Named Inventor: Sarunya Bangsaruntip; Mailing Date: Jun. 13, 2012.
Office Action—Non-Final for U.S. Appl. No. 12/856,718, filed Aug. 16, 2010; First Named Inventor: Sarunya Bangsaruntip; Mailing Date: Jul. 9, 2012.
Office Action—Restriction-Election for U.S. Appl. No. 12/856,718, filed Aug. 16, 2010; First Named Inventor: Sarunya Bangsaruntip; Mailing Date: Apr. 9, 2012.
Written Opinion for International Application No. PCT/US2011/029304; International Filing Date: Mar. 22, 2011; mailing date: May 20, 2011; 5 pages.

* cited by examiner

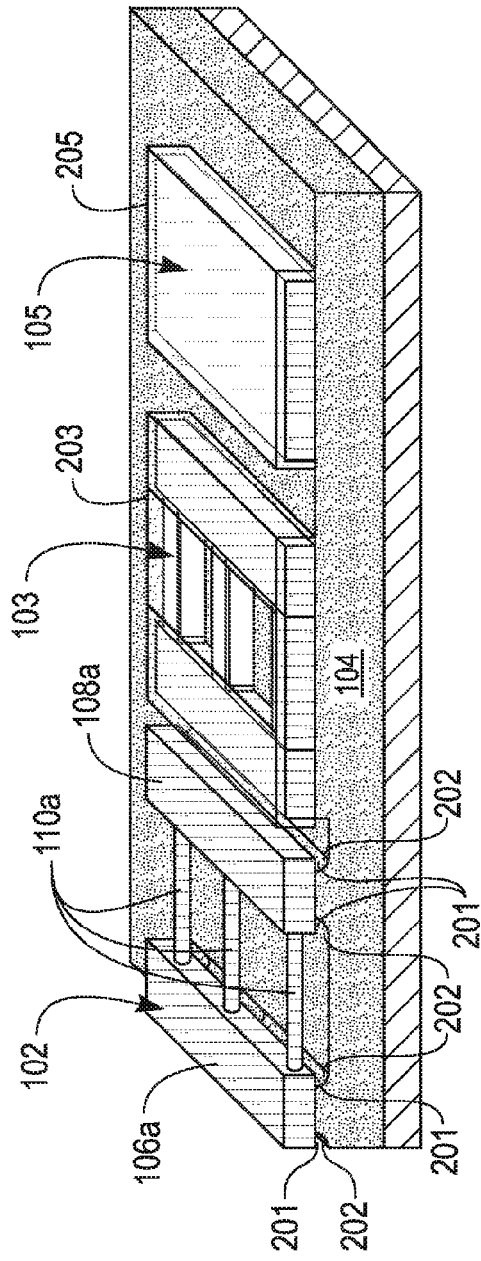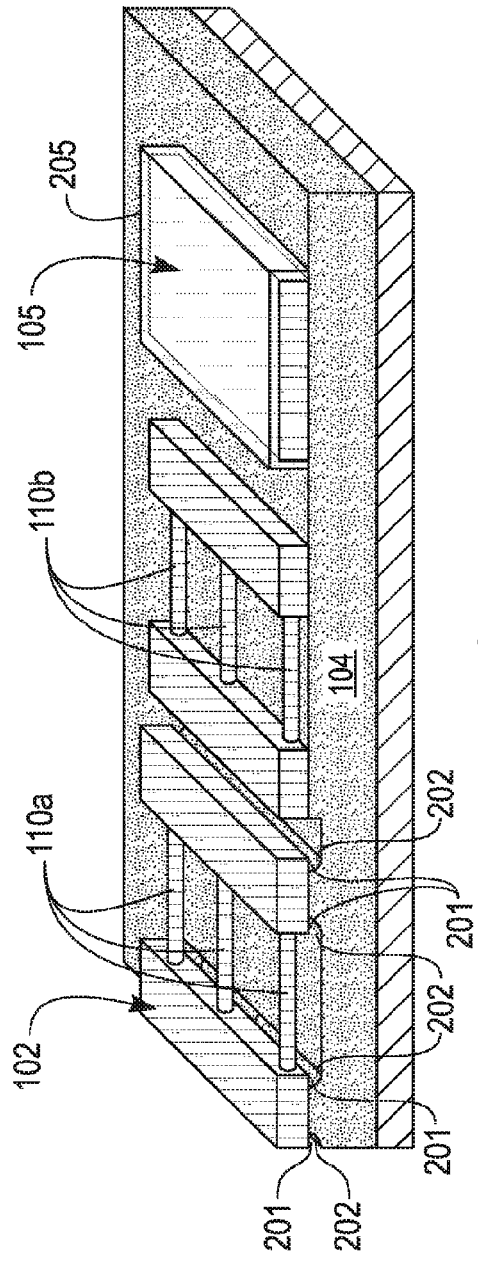

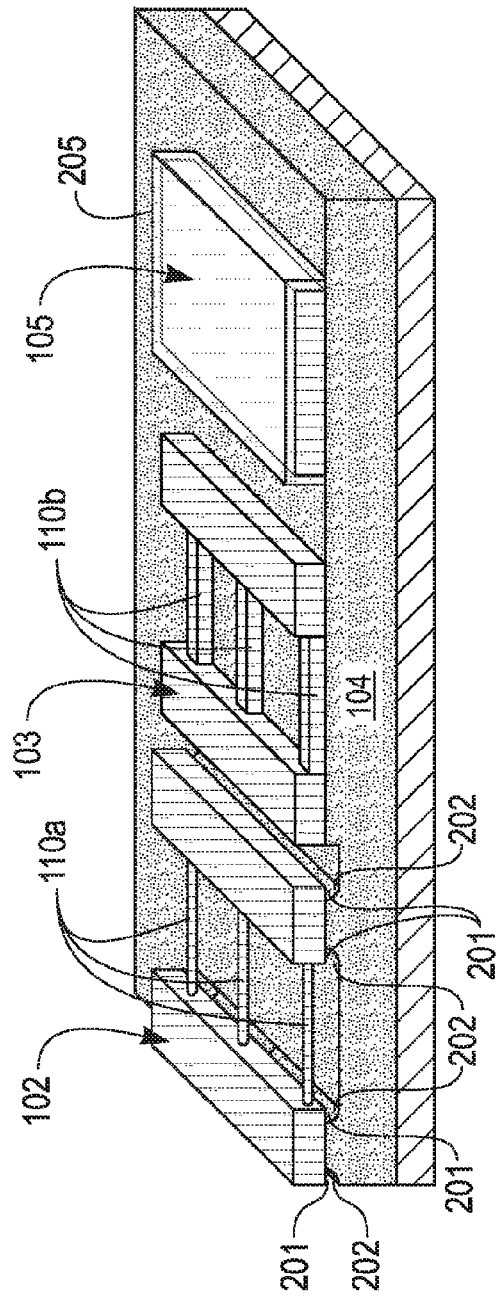
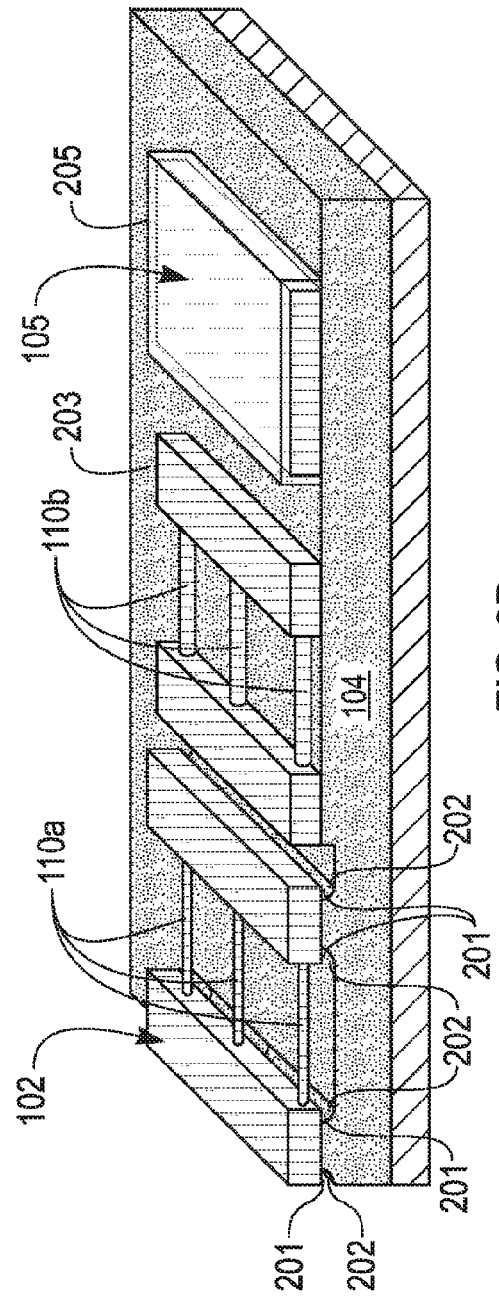
FIG. 3A
FIG. 3B

US 9,184,301 B2

PLANAR AND NANOWIRE FIELD EFFECT TRANSISTORS

CROSS-REFERENCE TO RELATED APPLICATIONS

This is a continuation application of and claims priority from U.S. application Ser. No. 12/631,342, filed on Dec. 4, 2009, the entire contents of which are incorporated herein by reference.

FIELD OF INVENTION

The present invention relates to semiconductor nanowire field effect transistors and planar field effect transistors.

DESCRIPTION OF RELATED ART

A nanowire field effect transistor (FET) includes doped portions of nanowire that contact the channel region and serve as source and drain regions of the device. Planar FETs include planar channel, source, and drain regions.

BRIEF SUMMARY

In an aspect of the present invention, an integrated circuit includes a plurality of gate-all-around (GAA) nanowire field effect transistors (FETs), a plurality of omega-gate nanowire FETs, and a plurality of planar channel FETs, wherein the plurality of GAA FETs, the plurality of omega-gate nanowire FETs, and the plurality of planar channel FETs are disposed on a single wafer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-8 illustrate an exemplary method for forming a field effect transistor (FET) devices.

DETAILED DESCRIPTION

An integrated circuit may include a number of different types of field effect transistor (FET) devices. Examples of FET devices include a planer channel FET, and a nanowire channel FET. A planar channel FET includes a silicon slab, a gate line formed over the silicon slab, a source region and a drain region adjacent to the gate line, and a channel region near the surface of the slab under the gate. The channel electrically connects the source region to the drain region while the gate controls the current in the channel. A nanowire channel FET includes silicon nanowires that connect on each side to a source region and a drain region, and a gate line that fully (or partially) surrounds the nanowires. The channel forms at the surface of the nanowires under the gate (or in the bulk of the nanowires for nanowires with diameter smaller than about 5 nm). When the gate fully surrounds the nanowire, the device is referred to as a gate-all-around (GAA) FET. When the gate partially surrounds the nanowires, as in the case when the nanowire is attached to an insulator, the device is referred to as an omega-gate FET. For integrated circuit applications where two or more device types are needed it is desirable to have a fabrication method that simultaneously form all three devices. The alternative of forming the devices sequentially is more expensive and also introduces limitations related to thermal exposure of completed devices of one type while fabricating devices of the second and third type. The methods and resultant structures described below involve fabrication of different types of FETs on the same chip or wafer. In particular the method forms all three types of FETs simultaneously without duplication of many processing steps.

Figure 1:
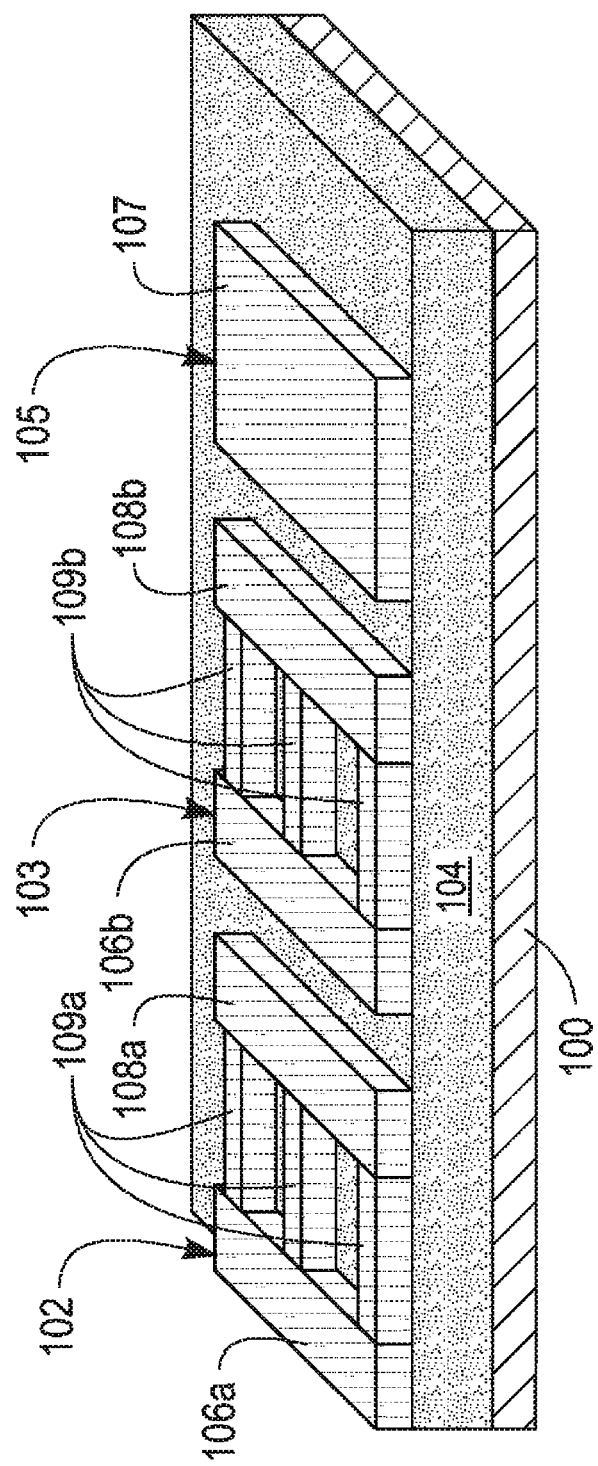

With reference now to FIG. 1, silicon on insulator (SOI) portions 102, 103, and 105 are defined on a buried oxide (BOX) layer 104 that is disposed on a silicon substrate 100. The SOI portion 102 is used to fabricate a gate all-around nanowire FET device, and includes a SOI pad region 106a, a SOI pad region 108a, and nanowire portions 109a. The SOI portion 103 is used to fabricate an omega-gate nanowire FET device, and includes a SOI pad region 106b, a SOI pad region 108b, and nanowire portions 109b. The SOI portion 105 is used to fabricate a planar FET device, and includes a SOI pad 107. The SOI portions 102, 103, and 105 may be patterned by, for example, the use of lithography followed by an etching process such as, for example, reactive ion etching (RIE).

FIG. 2A illustrates the resultant BOX layer 104 and SOI portion 102 following an isotropic etching process. In the illustrated embodiment, a hardmask layer 203 including, for example, a silicon nitride ($Si_3N_4$) has been disposed on the SOI portion 103, and protects the SOI portion 103 during the isotropic etching process. In the illustrated embodiment, the SOI portion 105 is covered with a hardmask layer 205 that similarly protects the SOI portion 105. In alternate embodiments, the hardmask layer 205 may not be disposed on the SOI portion 105. If the hardmask layer 205 is not disposed on the SOI portion 105, portions of the BOX layer 104 will be removed in the isotropic etching process by laterally etching portions of the BOX layer 104 under the edges of the SOI portion 105 resulting in undercuts similar to the undercuts 202 (described below). The BOX layer 104 is recessed in regions not covered by SOI portion 102. The isotropic etching results in the lateral etching of portions of the BOX layer 104 that are under the SOI portion 102. The lateral etch suspends the nanowires 109a above the BOX layer 104. The lateral etch forms the undercuts 202 in the BOX layer 104 and overhang portions 201 at the edges of SOI regions 106a and 108a. The isotropic etching of the BOX layer 104 may be, for example, performed using a diluted hydrofluoric acid (DHF). A 100:1 DHF etches approximately 2 to 3 nm of BOX layer 104 per minute at room temperature.

Following the isotropic etching of the BOX 104 the nanowire portions 109a (of FIG. 1) are smoothed to form elliptical shaped (and in some cases, cylindrical shaped) nanowires 110a that are suspended above the BOX layer 104 by the SOI pad region 106a and the SOI pad region 108a. The smoothing of the nanowires 109a may be performed by, for example, annealing of the nanowires 109a in hydrogen. Example annealing temperatures may be in the range of 600° C.-1000° C., and a hydrogen pressure of approximately 600 torr to 7 torr. In the illustrated embodiment, the hardmask layer 203 on the SOI portion 103 and the hardmask layer 205 on the SOI portion 105 are present during the annealing of the nanowires 109a.

FIG. 2B illustrates an example of the alternate resultant structure when the hardmask layer 203 on the SOI portion 103 is removed prior to the annealing process described above. During the annealing process, the nanowires 109b are smoothed to form elliptical shaped nanowires 210b that are in contact with the BOX layer 104. Though the illustrated embodiments include the hardmask layer 205 on the SOI portion 105 present during the annealing process, alternate embodiments may include removing the hardmask layer 205 from the SOI portion 105 prior to the annealing process. The annealing process will effect the exposed SOI portion 105.

FIG. 3A illustrates an optional process step in which nanowires 110a are thinned. The reduction of the dimensions of the nanowires 110a may be performed by, for example, a high temperature oxidation of the nanowires 110a followed by etching of the grown oxide. The oxidation and etching process may be repeated to achieve a desired nanowire 110a dimensions. Once the dimensions of the nanowires 110a have been reduced, gates (described below) are formed over the channel regions of the nanowires 110a and 110b.

FIG. 3B illustrates the nanowires 110a (of FIG. 2B) following an oxidation process that reduces the dimensions similar to the oxidation process described above in FIG. 3A. Once the desired dimensions of nanowires 110a are achieved, the process steps described below may be performed simultaneously on all of the devices.

Figure 4A:
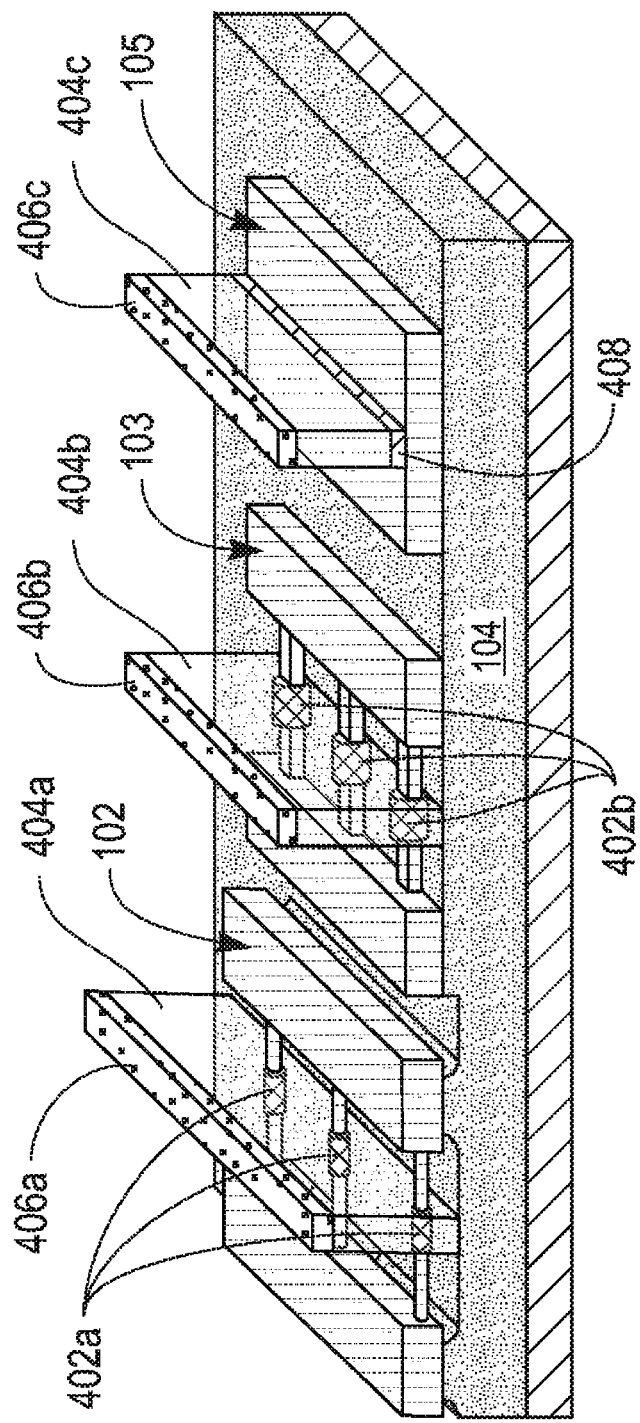
Figure 5A:
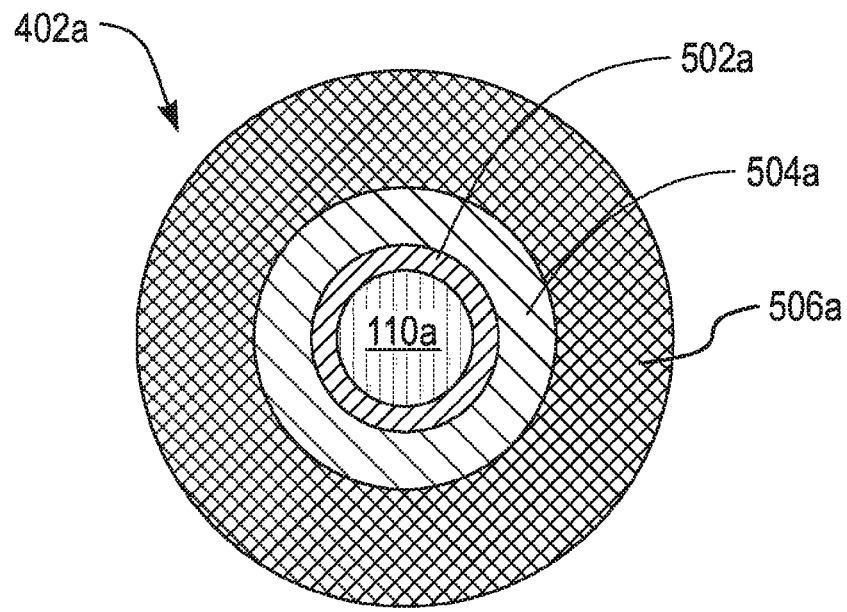
Figure 5B:
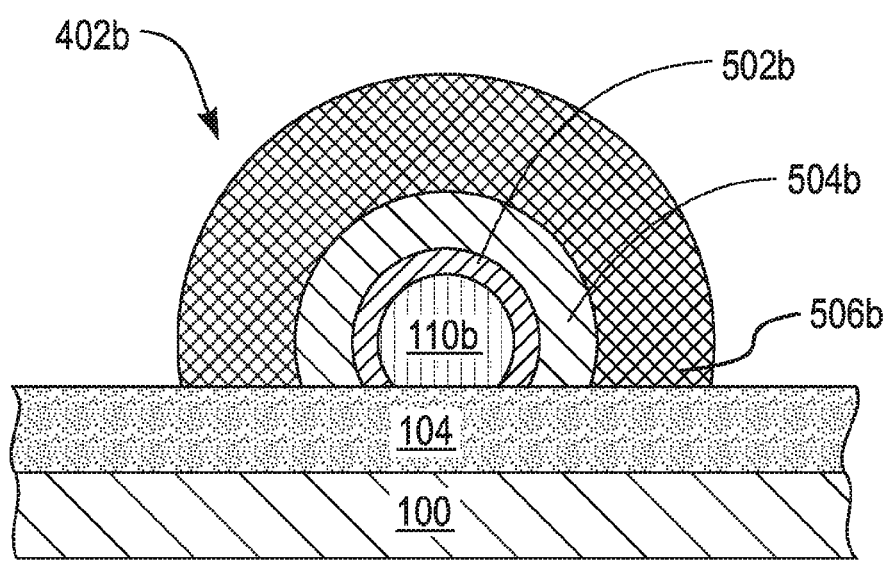

FIG. 4A illustrates gates 402a and 402b and 408 that are formed around the nanowires 110a, 110b, and over SOI slab 105, as described in further detail below, and capped with polysilicon layer 404. Hardmask lines 406a, 406b and 406c, are defined by patterning, for example a silicon nitride ($Si_3N_4$) layer that is deposited over the polysilicon layer 404. The polysilicon layer 404 and the hardmask lines 406a 406b, and 406c may be formed by depositing polysilicon material over the BOX layer 104 and the SOI portions 102, 103 and 105, depositing the hardmask material over the polysilicon material, and etching by RIE to form the polysilicon lines 404a, 404b, and 404c illustrated in FIG. 4A. The etching of the gates 402a, 402b, and 408 may be performed by directional etching that results in straight sidewalls of the gates 402a, 402b, and 408. Following the directional etching, polysilicon 404a remains under the nanowires 110a in regions not masked by the hardmask 406a. Isotropic etching may be performed to remove polysilicon 404a from under the nanowires 110a. With reference to FIGS. 5A and 5B the gate stack 402a, 402b, and 408 is formed by depositing a conformal gate dielectric film 502a such $SiO_2$, SiON, or $HfO_2$ (or other hi-K material) around the nanowires. A second conformal gate dielectric film 504a may also be applied. A metal gate film 506a such as, for example, TaN or TiN is deposited over the gate dielectric. Poly-silicon 404 is deposited over the metal gate film of the gates.

Figure 4B:
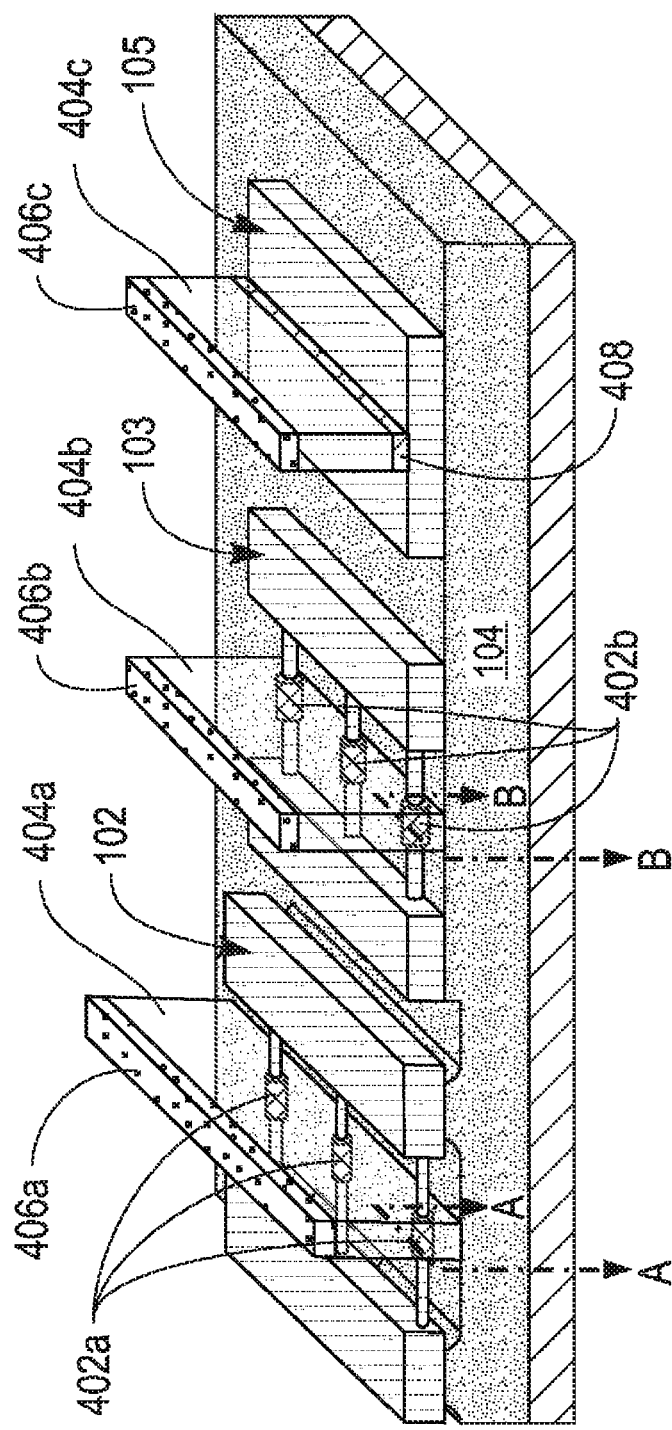

FIG. 4B illustrates the nanowires 110a and 110b that are formed using a similar process as described above in FIG. 4A following the oxidation process of FIG. 3B.

Though the methods as described above illustrate the fabrication of a single row of gates, similar methods described herein may be used to form any number of devices on a nanowires 110a, and 110b between SOI pad regions 106a and 108a and 106b and 108b and the SOI portion 105.

FIG. 5A illustrates a cross sectional view of a gate 402a along the line A-A (of FIG. 4B). The gate 402a is formed by depositing a first gate dielectric layer 502a, such as silicon dioxide ($SiO_2$) around the nanowire 110a. A second gate dielectric layer 504a such as, for example, hafnium oxide ($HfO_2$) is formed around the silicon oxide layer 502a. A metal layer 506a such as, for example, tantalum nitride (TaN) is formed around the dielectric layer 504a. The metal layer 506a is surrounded by polysilicon layer 404a (of FIG. 4B). Doping the polysilicon layer 404a with impurities such as boron (p-type), or phosphorus (n-type) makes the polysilicon layer 404a conductive.

FIG. 5B illustrates a cross sectional view of a gate 402b along the line B-B of FIG. 4B formed by a similar process as described above, and including first gate dielectric layer 502b around the nanowire 110b, second gate dielectric layer 504b, and a metal layer 506b surrounded by the polysilicon layer 404b. The gate stack 408 includes the dielectric layer disposed on the SOI portion 105, the second gate dielectric layer 504, and the metal layer 506 that is capped by poly-silicon 404. Since the channel of device 105 is planar as it forms in a planar SOI slab, the films comprising gate stack 408 also have a planar geometry.

Figure 6A:
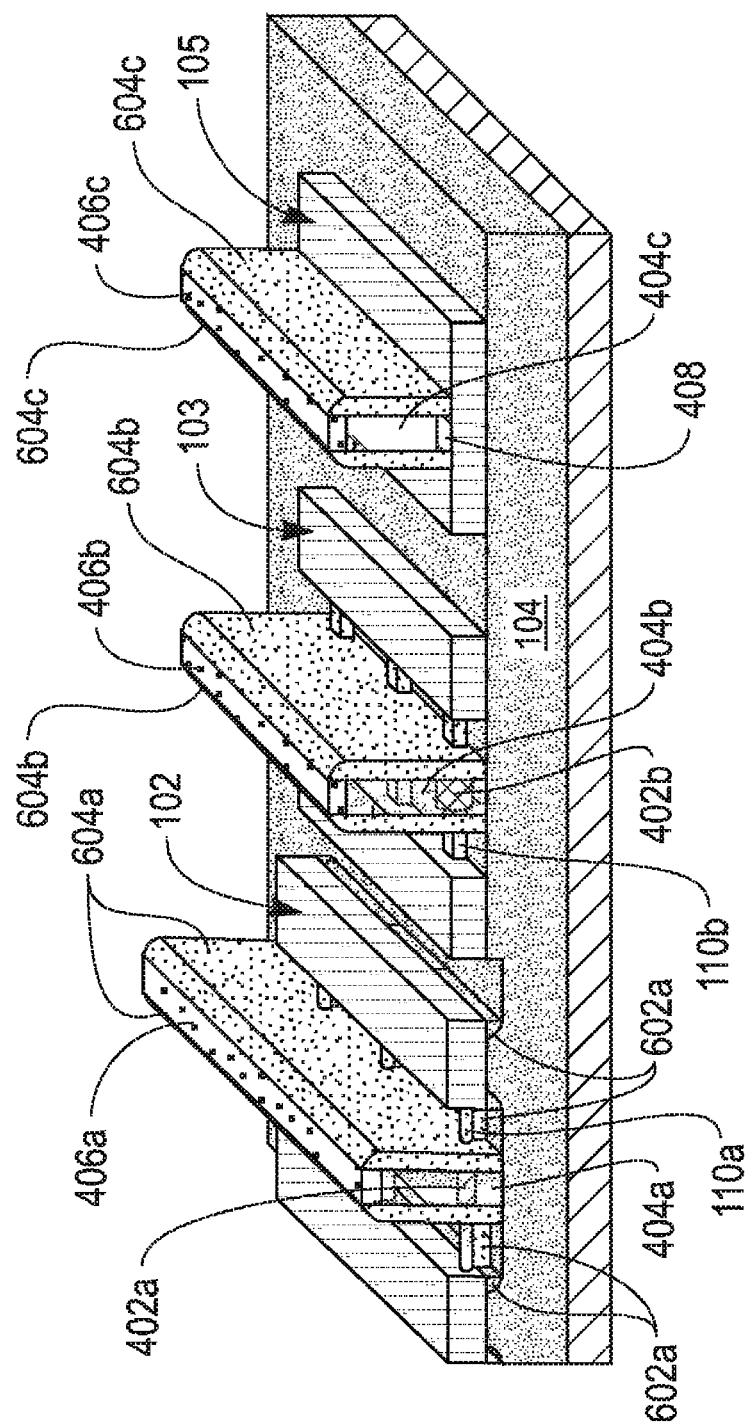
Figure 6B:
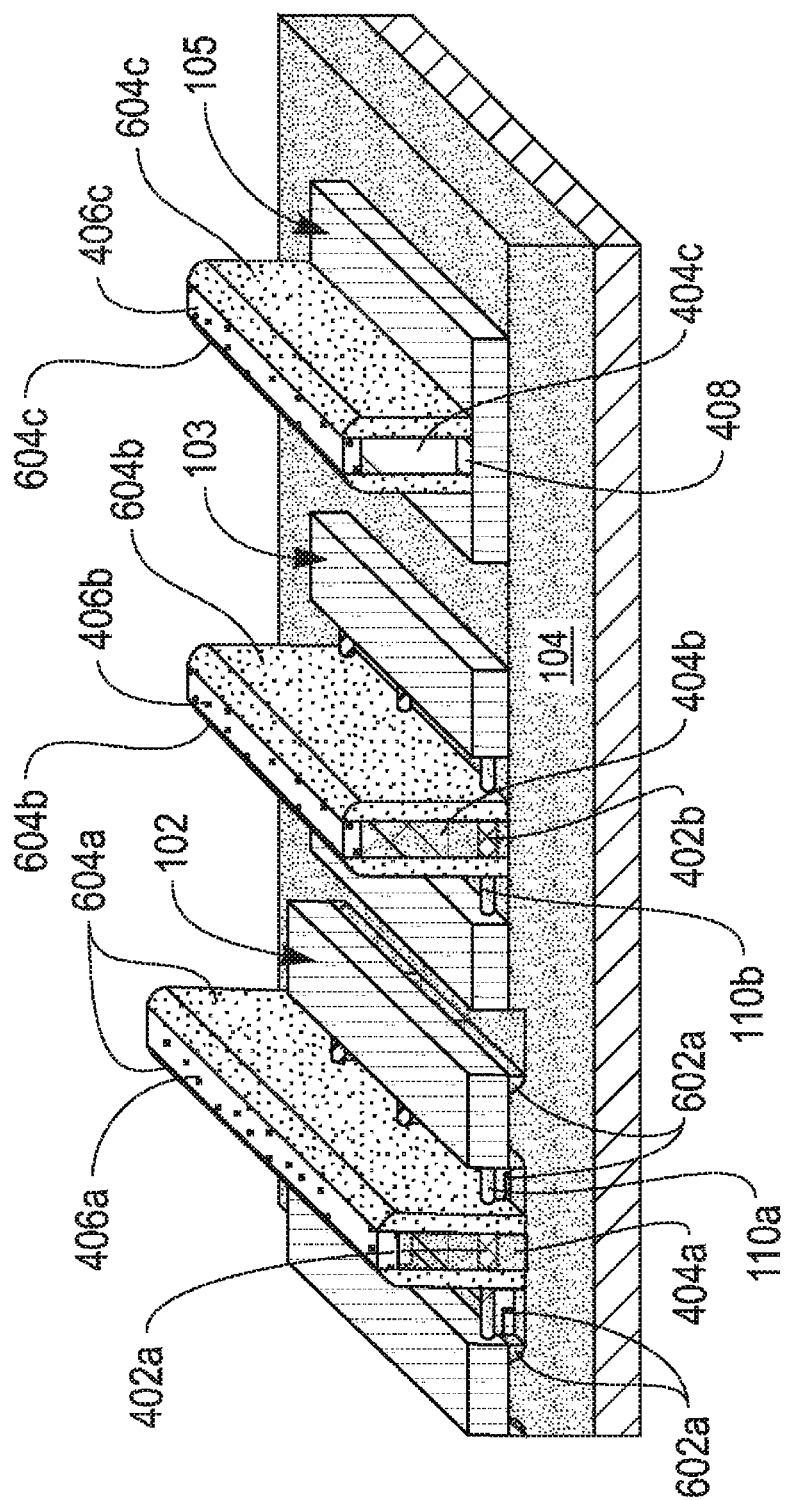

FIGS. 6A and 6B illustrate the spacer portions 604a, 604b, and 604c formed along opposing sides of the polysilicon lines 404a, 404b, and 404c. The spacers 604a, 604b, and 604c are formed by depositing a blanket dielectric film such as silicon nitride and etching the dielectric film from all horizontal surfaces by RIE. The spacers 604a and 604b are formed around portions of the nanowires 110a and 110b that extend from the polysilicon layers 404a and 104b and surround portions of the nanowires 110a and 110b. FIG. 6A includes spacer portions 602a and 602b that are formed under the nanowires 110a, and in the undercut regions 202 (of FIG. 2).

Figure 7:
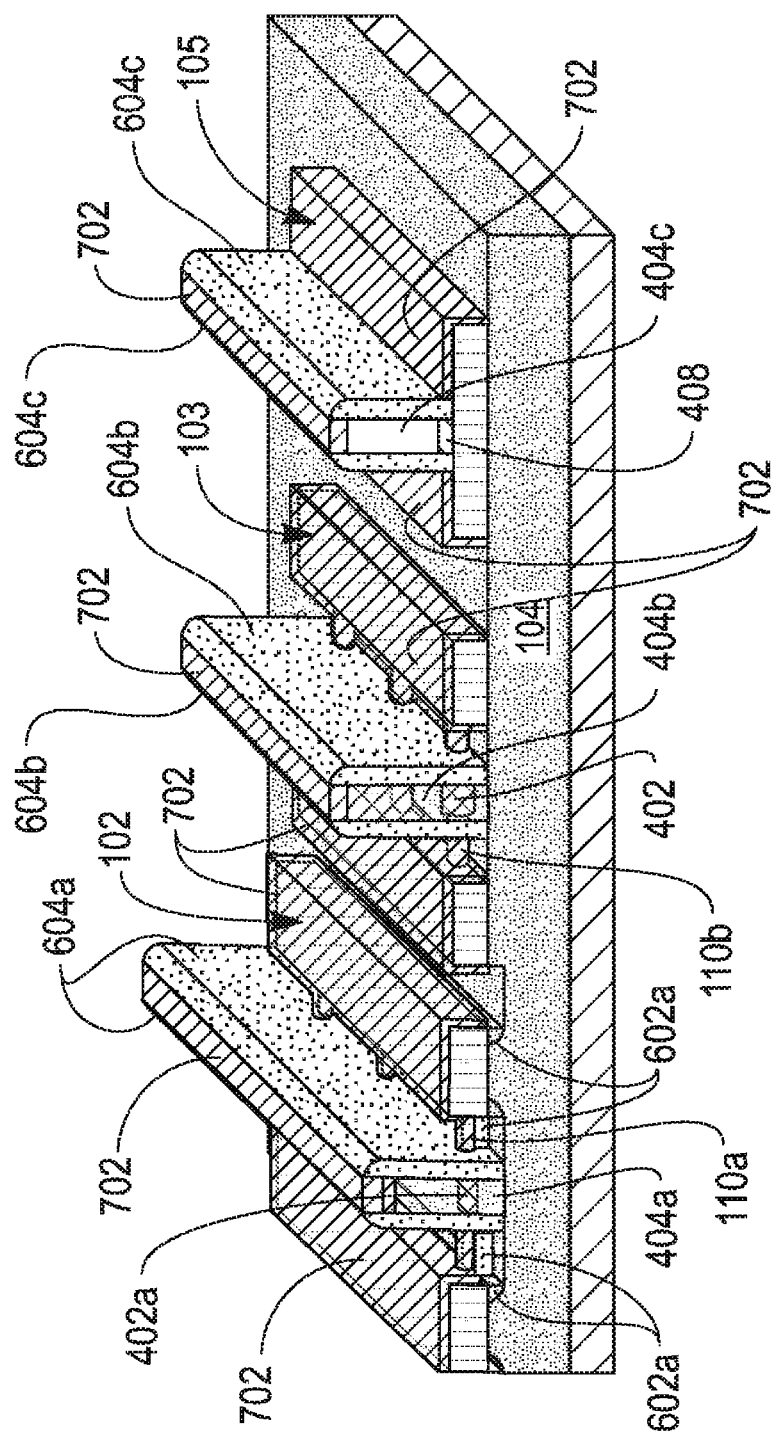

FIG. 7 illustrates the resultant structures (of FIGS. 6A and 6B) following a selective epi-silicon growth that thickens the exposed nanowire portions not covered by the gate 404a and 404b and spacers 604. The epitaxial growth 702 thickens the SOI pads 106a, 108a, 106b, 108b and portions of SOI 105 not covered by the gate 404c and spacers 604c. The epitaxial growth may merge the adjacent nanowires 110 together with epi-silicon. The thickened/merged nanowires and SOI regions are formed by epitaxially growing, for example, in-situ doped silicon (Si) or a silicon germanium (SiGe) that may be either n-type or p-type doped. The in-situ doped epi process forms the source region and the drain region of the nanowire FET. As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may be $GeH_4$, which may obtain deposition selectivity without HCL. Precursors for dopants may include $PH_3$ or $AsH_3$ for n-type doping and $B_2H_6$ for p-type doping. Deposition temperatures may range from 550 C to 1000 C for pure silicon deposition, and as low as 300 C for pure Ge deposition.

Figure 8:
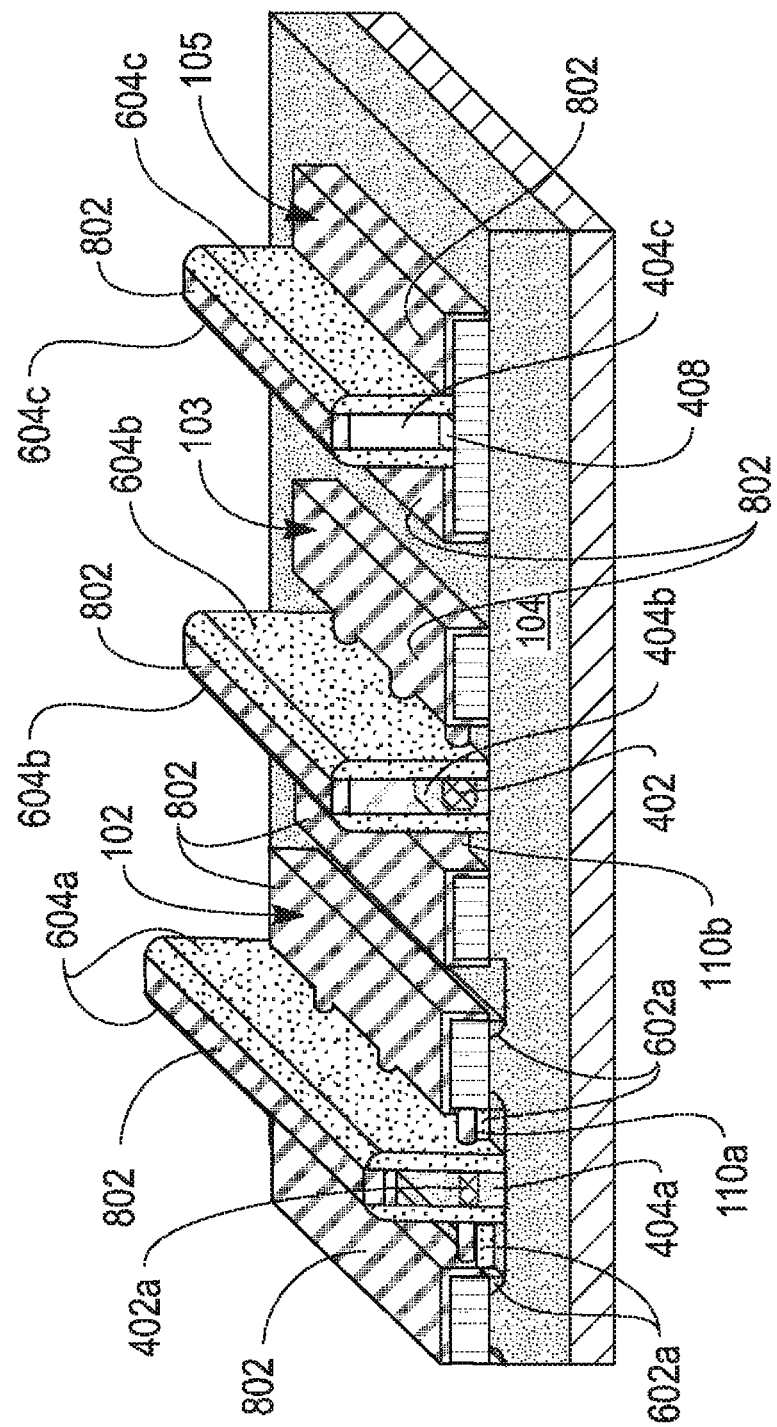

FIG. 8 illustrates a resultant structure following silicidation where a silicide 802 is formed on the exposed epitaxy 702. Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An integrated circuit including:
   a plurality of gate-all-around (GAA) nanowire field effect transistors (FETs);
   a plurality of omega-gate nanowire FETs, wherein the omega-gate nanowire FET is includes a nanowire portion arranged on a buried oxide layer, the nanowire portion of the omega-gate nanowire FET having a bottom surface coplanar and in contact with a top layer of the buried oxide layer; and
   a plurality of planar channel FETs, wherein the plurality of GAA FETs, the plurality of omega-gate nanowire FETs, and the plurality of planar channel FETs are disposed on a single wafer.

2. The integrated circuit of claim 1, wherein the plurality of GAA FETs, the plurality of omega-gate nanowire FETs, and the plurality of planar channel FETs are fabricated simultaneously.

3. The integrated circuit of claim 1, wherein each GAA FET includes:
   a source region;
   a drain region;
   a nanowire connecting the source region to the drain region; and
   a gate structure surrounding the nanowire.

4. The integrated circuit of claim 1, wherein each omega-gate FET includes:
   a source region;
   a drain region;
   a nanowire connecting the source region to the drain region; and
   a gate structure partially surrounding the nanowire.

5. The integrated circuit of claim 1, wherein each planar channel FET includes:
   a gate on a silicon slab;
   a source region adjacent to a first side of the gate on the silicon slab; and
   a drain region adjacent to a second side of the gate on the silicon slab.

* * * * *